United States Patent
Harnishfeger

(10) Patent No.: US 8,433,255 B2
(45) Date of Patent: Apr. 30, 2013

(54) SYSTEM AND METHOD FOR REDUCING TEMPERATURE-DEPENDENT AND PROCESS-DEPENDENT FREQUENCY VARIATION OF A CRYSTAL OSCILLATOR CIRCUIT

(75) Inventor: David Harnishfeger, Chandler, AZ (US)

(73) Assignee: Fujitsu Semiconductor Limited, Yokohama-shi (JP)

( * ) Notice: Subject to any disclaimer, the term of this patent is extended or adjusted under 35 U.S.C. 154(b) by 0 days.

(21) Appl. No.: 13/176,509

(22) Filed: Jul. 5, 2011

(65) Prior Publication Data
US 2013/0012141 A1 Jan. 10, 2013

(51) Int. Cl.
*H04B 1/40* (2006.01)

(52) U.S. Cl.
USPC .......... 455/75; 455/255; 455/262; 455/264; 455/318; 331/44; 331/176

(58) Field of Classification Search ......... 455/75, 455/318, 264, 262, 255; 331/176, 44, 177
See application file for complete search history.

(56) References Cited

U.S. PATENT DOCUMENTS

| | | | | |
|---|---|---|---|---|
| 5,041,799 A | * | 8/1991 | Pirez | 331/44 |
| 2003/0071696 A1 | * | 4/2003 | Kubo et al. | 331/176 |
| 2005/0128017 A1 | * | 6/2005 | Meltzer | 331/176 |
| 2011/0140864 A1 | * | 6/2011 | Bucci | 340/10.42 |

FOREIGN PATENT DOCUMENTS

| | | |
|---|---|---|
| WO | WO 03/073629 | 9/2003 |
| WO | WO 2006/102637 | 9/2006 |
| WO | WO 2008/021810 | 2/2008 |

OTHER PUBLICATIONS

Extended European Search Report; Application No. 12173484.2-1233; Pgs. 6 Jan. 7, 2013.

* cited by examiner

*Primary Examiner* — Sanh Phu
(74) *Attorney, Agent, or Firm* — Baker Botts L.L.P.

(57) ABSTRACT

In embodiments of the present disclosure, a method may include determining an ambient temperature of an oscillator. The method may also include estimating an approximate frequency of operation of the oscillator. The method may additional include determining a process-based compensation to be applied to a resonator of the oscillator based on the approximate frequency. The method may further include setting a capacitance of a variable capacitor coupled to the resonator in order to compensate for temperature-dependent and process-dependent frequency variation of the oscillator based on the ambient temperature and the process-based compensation.

20 Claims, 4 Drawing Sheets

SYSTEM AND METHOD FOR REDUCING TEMPERATURE-DEPENDENT AND PROCESS-DEPENDENT FREQUENCY VARIATION OF A CRYSTAL OSCILLATOR CIRCUIT

TECHNICAL FIELD

The present disclosure relates generally to wireless communication and, more particularly, to reducing temperature-dependent frequency variation of crystal oscillator circuits.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

Transmitters, receivers, and transceivers often include components known as oscillators. An oscillator may serve many functions in a transmitter, receiver, and/or transceiver, including generating local oscillator signal (usually in a radio-frequency range) for upconverting baseband signals onto a radio-frequency (RF) carrier and performing modulation for transmission of signals, and/or for downconverting RF signals to baseband signals and performing demodulation of received signals.

To achieve desired functionality, such oscillators must often have designs that produce precise operating characteristics. For example, it is often critical that oscillator circuits operate independently of the temperature of the oscillator circuit. However, in many existing oscillator circuits, variations in temperature may lead to undesired variations in the frequency of oscillation of an oscillator circuit. Such variations over temperature may result from various factors, including temperature dependence of a resonator used to create an oscillation frequency.

As is known in the art, the frequency response of a crystal resonator as a function if temperature may be approximated by the following equation:

$$f(T)=f_0+a_1(T-T_0)+a_2(T-T_0)^2+a_3(T-T_0)^3$$

where:

T is the temperature, f(T) is the resonant frequency of the resonator at temperature T, and $f_0$ is the resonant frequency of the crystal at temperature $T_0$. As is also known, the coefficients $a_1$, $a_2$, and $a_3$ of the above equation may vary such that each resonator must be separately characterized to determine its frequency versus temperature response.

In addition to the polynomial equation set forth above, a lot of crystal resonators may be characterized over a series of temperatures to determine their frequency versus temperature responses, such data may be stored in a lookup table or other data structure. As a result, a typical frequency versus temperature response may be determined by reference to the lookup table.

Designers of oscillator circuits often include compensation circuitry in order to minimize the temperature dependence of resonators in an effort to maintain an approximately constant output frequency over a given temperature range. Initially, during manufacturing a compensation circuit would be manually adjusted based upon grading or characterization of the resonator. Such approach was prone to human error and time consuming. To overcome the shortcomings of the practice of manual adjustment of compensation circuits based on grading, an approach was developed whereby a temperature sensing circuit of an oscillator would determine temperature and, based on such temperature, a compensation circuit of the oscillator would vary the capacitance of a variable capacitor coupled to a resonator, this inducing a frequency change in the oscillator circuit compensating for the frequency change of the resonator due to temperature. Such temperature based compensation was often determined by characterizing a random sample of resonators to determine a typical or average temperature dependence characteristic for a lot of crystals.

However, such approaches did not adequately compensate for process variations among resonators. For example, as is known in the art, a resonator may be statistically modeled as a resistor, inductor, and two capacitors, as shown in FIG. 5. Due to process variations during manufacture, the properties of such modeled electrical elements (e.g., resistance, inductance, and capacitance) may vary from one resonator to the next. Due to such variations, the temperature dependence functions of each resonator in a lot may vary from one another, thus reducing the effectiveness of applying an averaged temperature characteristic as a means of temperature compensation. That is, referencing the equation above, each resonator may have varying values of $f_0$, $T_0$, $a_1$, $a_2$, and/or $a_3$, or may deviate from lookup table entries characterizing the expected frequency versus temperature characteristics of a lot of resonators. Thus, using traditional approaches, in order to adequately account for such process variations in resonators, time-consuming and error-prone grading of crystals may be required.

SUMMARY

In accordance with some embodiments of the present disclosure, an oscillator may include a resonator, a temperature sensor, a temperature compensation calculator, a frequency estimator, a process compensation calculator, a control module, and a variable capacitor. The temperature sensor may be configured to output a temperature signal indicative of an ambient temperature of the oscillator. The temperature compensation calculator may be configured to, based on the temperature signal, output a temperature-based frequency compensation signal. The frequency estimator may be configured to, based on a detected approximate frequency of operation of the oscillator, output a frequency estimation signal. The process compensation calculator may be configured to, based on the frequency estimation signal, output a process-based compensation signal. The control module may be configured to, based on the temperature-based frequency compensation signal and the process-based compensation signal, output a control signal. The variable capacitor coupled to the resonator, a capacitance of the variable capacitor established based on the control signal.

Technical advantages of one or more embodiments of the present disclosure may include an approach whereby both temperature-dependent and process-dependent variations of an oscillator from a nominal resonator frequency may be reduced or eliminated while reducing the need to characterize each and every resonator of a lot placed in oscillators.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
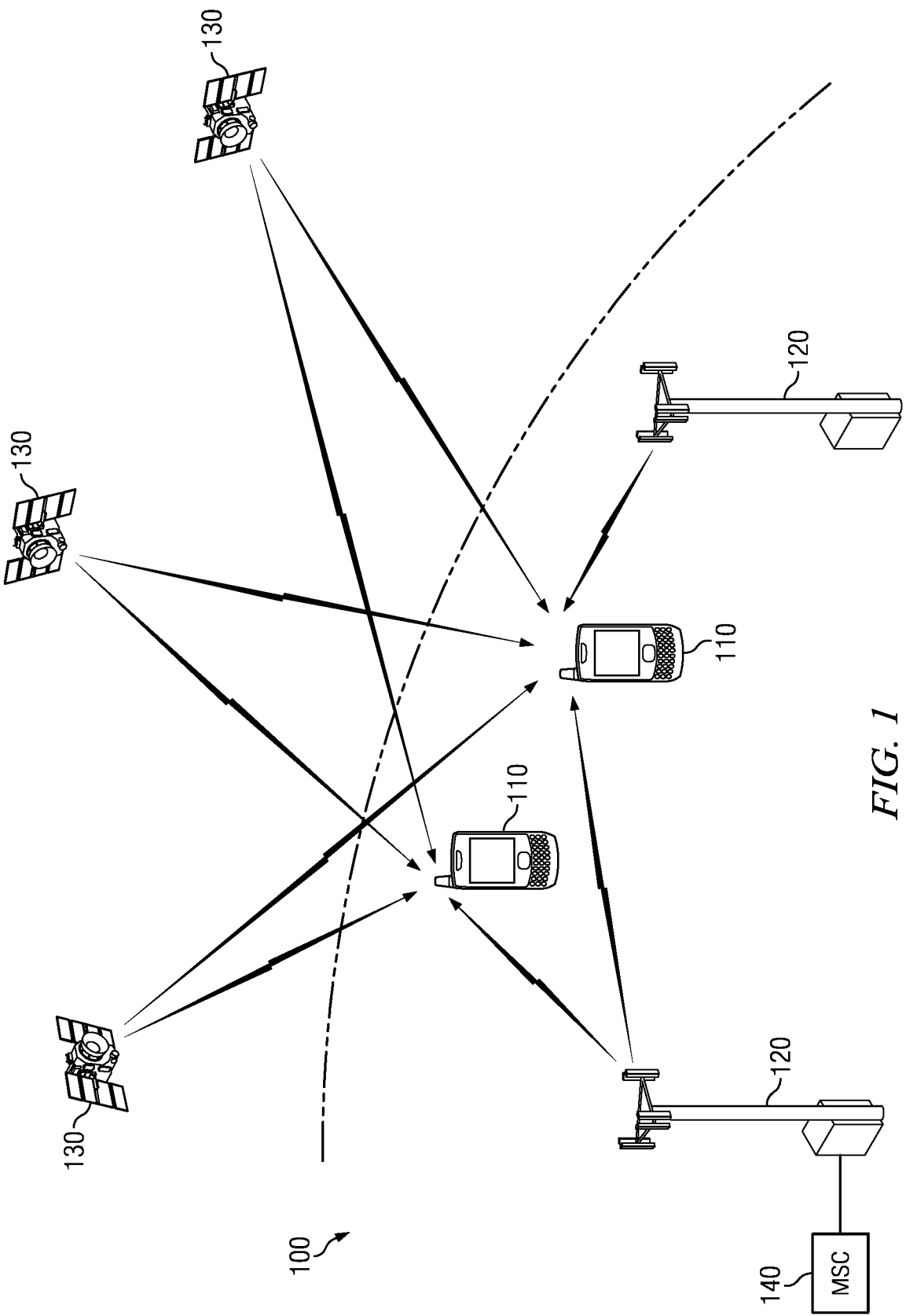
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
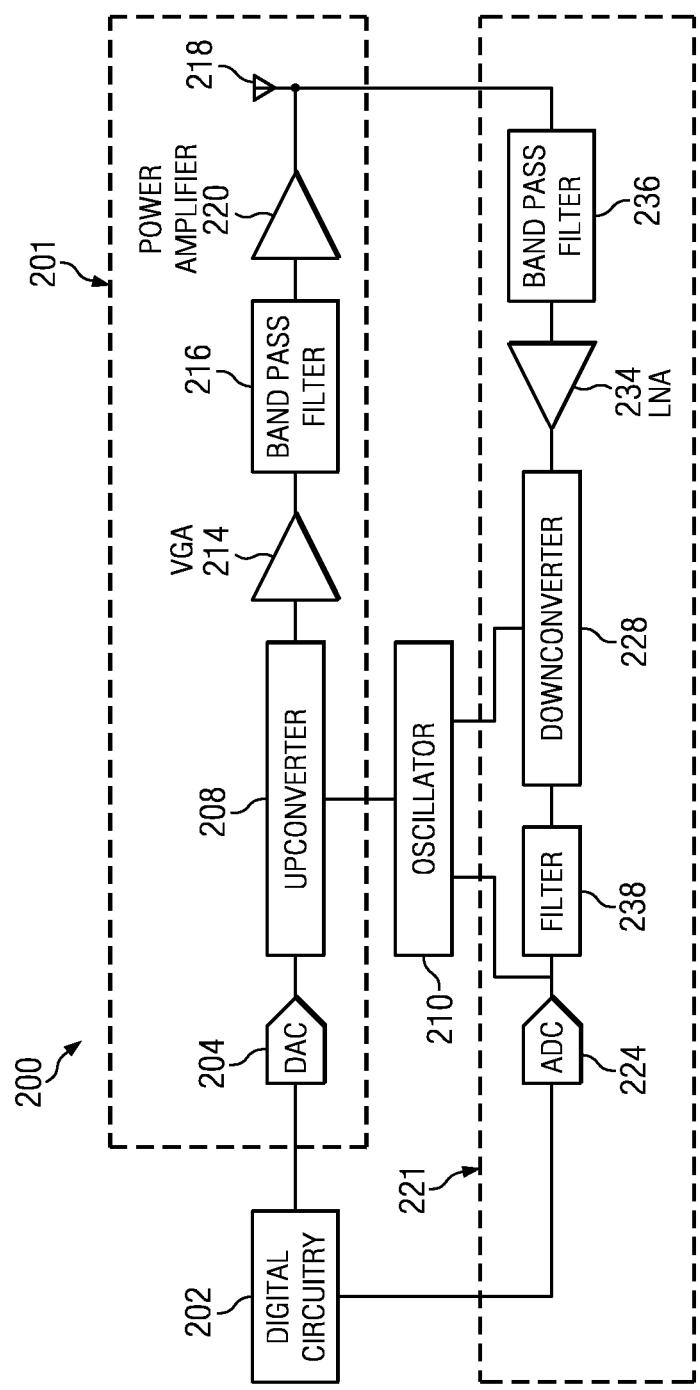
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator. Oscillator 210 may be described in greater detail below with reference to FIG. 3.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include a filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from filter 238 and convert such analog signal into a digital signal. Such digital signal may then be passed to digital circuitry 202 for processing.

Figure 3:
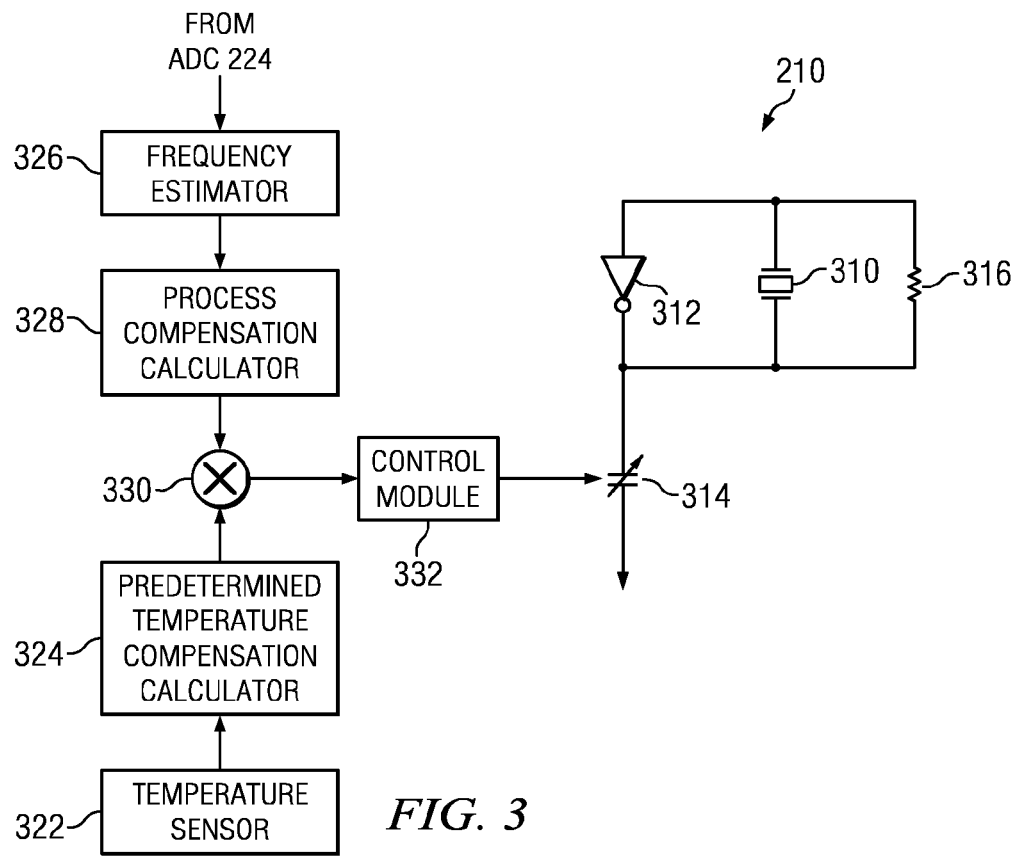
FIG. 3 illustrates a block diagram of an example oscillator, in accordance with certain embodiments of the present disclosure.

FIG. 3 illustrates a block diagram of certain embodiments of oscillator 210, in accordance with certain embodiments of the present disclosure. As shown in FIG. 3, oscillator 210 may include a resonator 310 in parallel with an active element 312. Resonator 310 may include any piezoelectric material (e.g., a quartz crystal) with a mechanical resonance that may, in conjunction with other components of oscillator 210, create an electrical signal with a highly-precise frequency.

Active element 312 may include any system, device or apparatus configured to produce at its output a waveform with an approximate 180-degree phase shift from its input. In some embodiments, active element 312 may include an inverter, as depicted in FIG. 3. In such embodiments, if active element 312 receives a low voltage (e.g., logic 0) driven on its input, and may drive a high voltage (e.g., logic 1) on its output. Alternatively, if active element 312 receives a high voltage (e.g., logic 1) driven on its input, it may drive a low voltage (e.g., logic 0) on its output. Active element 312 may be implemented as a PMOS inverter, NMOS inverter, static CMOS inverter, saturated-load digital inverter, or any other suitable implementation. However, during operation, when implemented as an inverter, active element 312 may be biased in its linear region by means of feedback resistor 316, thus allowing it to operate as a high gain inverting amplifier. Resistor 316 may serve as a self-biasing resistor that provides a feedback path between the input and output of active element 312.

Each terminal of resonator 310 may also be coupled to one or more variable capacitors 314. As implied by its name, variable capacitor 314 may have a variable capacitance, thus allowing for tuning of the output frequency of oscillator 210. The variable capacitance of variable capacitor 314 may be controlled by control module 332, as described in greater detail below.

As depicted in FIG. 3, oscillator 210 may also include a temperature sensor 322 coupled at its output to an input of predetermined temperature compensation calculator 324. Temperature sensor 322 may include any system, device, or apparatus configured to generate an electric or electronic signal (e.g., voltage or current) indicative of a temperature. For example, in some embodiments, temperature sensor 322 may include a thermistor in series with a resistor. A thermistor may include a resistive device whose resistance varies significantly with temperature. Accordingly, the thermistor and the resistor may create a voltage divider whereby the voltage at a node common to the thermistor and the resistor may be a function of the temperature of the thermistor. In operation, temperature sensor 322 or components thereof may be placed proximate to components of oscillator 210 for which temperature measurement is desired (e.g., resonator 310).

Figure 4:
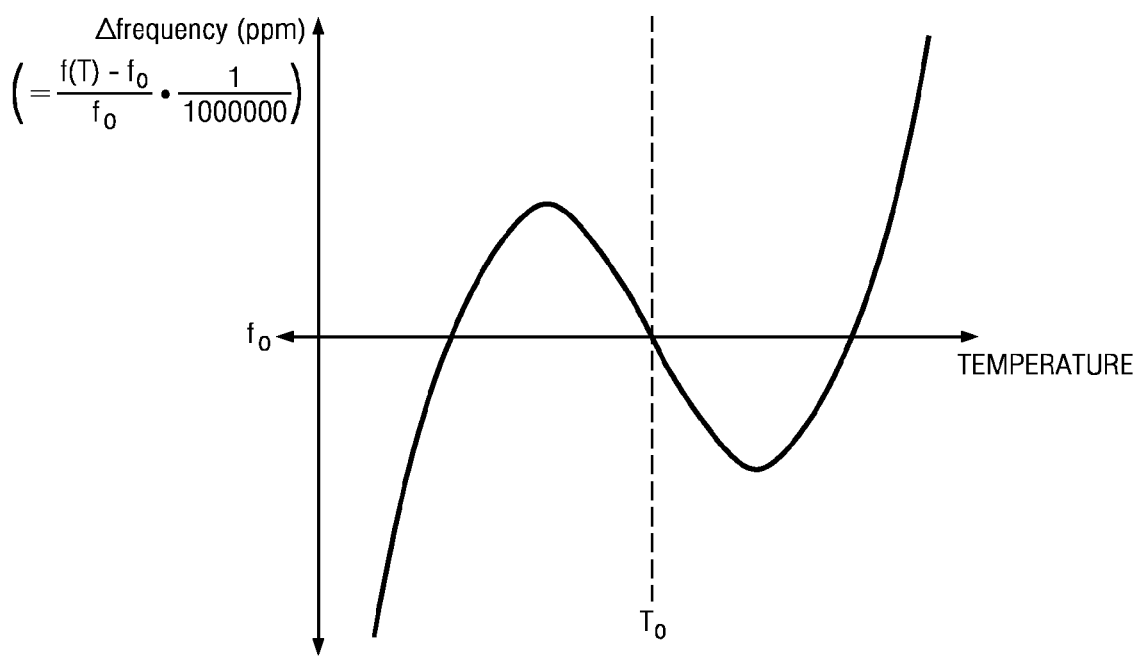
FIG. 4 illustrates an example graph of average frequency change versus temperature for a lot of resonators, in accordance with certain embodiments of the present disclosure.

Predetermined temperature compensation calculator 324 may include any system, device, or apparatus configured to based on a temperature signal (e.g., voltage) received from temperature sensor 322 indicative of a temperature, generate an approximate temperature-based frequency compensation signal. The approximate temperature-based frequency compensation signal may be based on characterization performed on a lot of resonators from which resonator 310 may have been drawn. Such characterization may determine, for the lot of resonators, an average, expected, or typical temperature dependency of the resonators on frequency of the resonators. For example, characterization may determine for a lot of resonators that such resonators have, on average, the frequency-versus-temperature characteristic shown depicted in FIG. 4. In FIG. 4, the vertical axis represents a change in frequency from a given nominal frequency $f_0$ given in parts per million (ppm) of the nominal frequency $f_0$, while the horizontal axis represents an ambient temperature. Thus, based on characterization such as that depicted in FIG. 4, it may be determined for a typical crystal oscillator of a lot of crystal oscillators an amount of compensation required to compensate for temperature-dependent frequency variation. Such characterization data may be stored (e.g., as a database, data file, table, map, and/or other structured data) in a read-only memory and/or other computer-readable medium within predetermined temperature compensation calculator 324 or another component of wireless communication device 200. Accordingly, based on a temperature signal received from temperature sensor 322, predetermined temperature compensation calculator 324 may reference such characterization data to determine an approximate frequency compensation for the associated temperature, and output a temperature-based frequency compensation signal indicative of such frequency compensation.

As shown in FIG. 3, oscillator 210 may include a frequency estimator 326. Frequency estimator 326 may include any system, device, or apparatus configured to, based on one or more received inputs, estimate a frequency at which a receive path or transmit path of wireless communication device 200 is operating and output a frequency estimation signal indicative of such operating frequency. For example, frequency estimator 326 may receive one or more signals from the output of ADC 224 and based on such signals, determine an approximate frequency of such signals. Such frequency estimation may be performed in the frequency domain using fest Fourier transforms, in the time domain using pulse counters, or by any other method known by those of skill in the art.

In addition, oscillator 210 may also include a process compensation calculator 328. Process compensation calculator 328 may include any system, device, or apparatus configured to, based on the frequency estimation signal received from frequency estimator 326, calculate a process-dependent compensation for resonator 310, and output a process-based compensation signal indicative of such calculated process-dependent compensation. In some embodiments, the process-dependent compensation may be or may be indicative of a multiplicative factor. To illustrate the functionality of process compensation calculator 328, reference is made to FIGS. 5 and 6 and the discussion of FIGS. 5 and 6 below.

Figure 5:
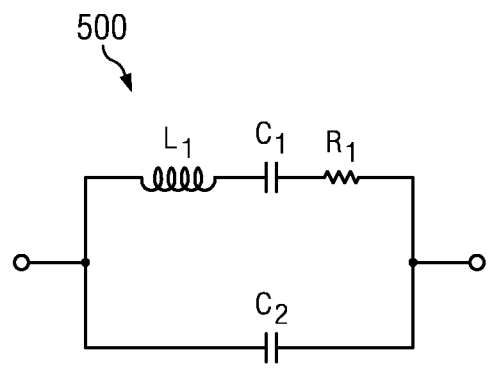
FIG. 5 illustrates a block diagram of an example statistical model for a resonator, in accordance with certain embodiments of the present disclosure.
Figure 6:
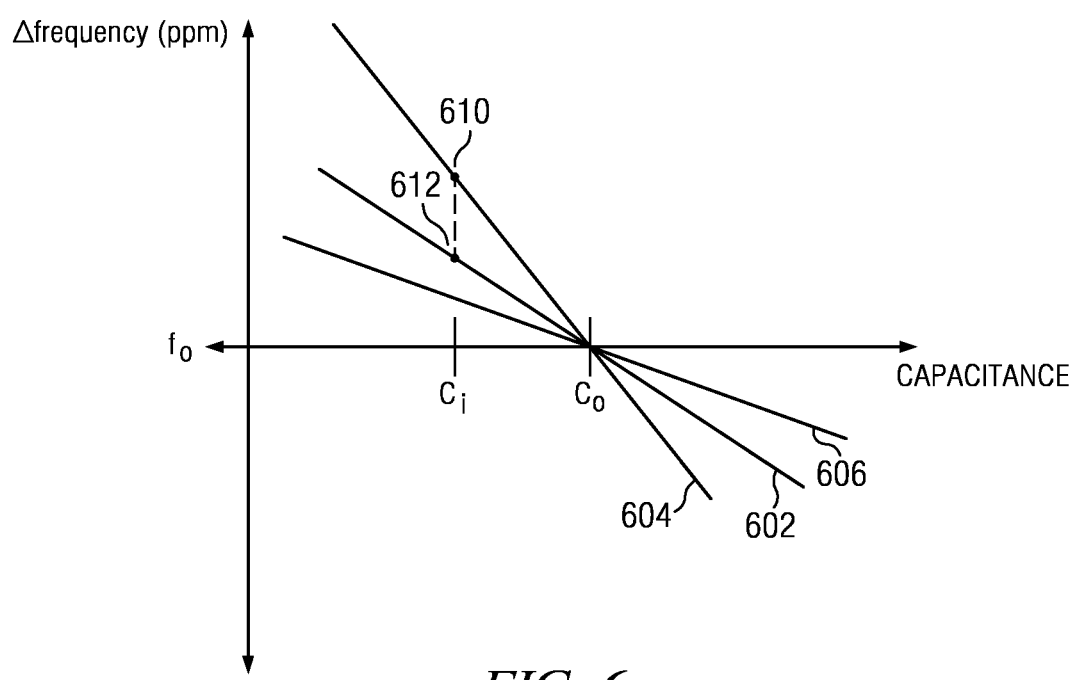
FIG. 6 illustrates a linealized frequency variation of an oscillator versus load capacitance of a variable capacitor within an oscillator for three different example resonators, in accordance with certain embodiments of the present disclosure.

FIG. 5 illustrates a block diagram of an example statistical model 500 for a resonator, in accordance with certain embodiments of the present disclosure. As shown in FIG. 5, statistical model 500 may include a capacitor $C_2$ in parallel with the series combination of an inductor $L_1$, a capacitor $C_1$, and a resistor $R_1$. In operation, a resonator may exhibit behavior approximating that of the statistical model. However, due to process variations during manufacture of resonators, values of capacitance, inductance, and resistance of the statistical model may vary among resonators intended to be "identical." As an example illustration of this phenomenon, FIG. 6 depicts a linearized frequency variation (in ppm) of an oscillator versus load capacitance of a variable capacitor (e.g., variable capacitor 314) coupled to a resonator (e.g., resonator 310) within such an oscillator for three different resonators. Curve 602 depicts oscillator frequency variation versus variable capacitor capacitance for an average resonator of a lot having average, expected, or typical characteristics for resonators of the lot. Curve 604 depicts oscillator frequency variation versus variable capacitor capacitance for a resonator of the lot having greater frequency sensitivity to varying capacitance as compared to the average resonator represented by curve 602. Curve 606 depicts oscillator frequency variation versus variable capacitor capacitance for a resonator of the lot having lesser frequency sensitivity to varying capacitance as compared to the average resonator represented by curve 602. In certain instances, each curve 602, 604, and 606 or portions thereof may be designed to approximate a linear curve with a slope. Each curve may also intersect at a calibration capacitance $C_0$ for which each curve may have a frequency at a nominal frequency $f_0$. In some instances, the nominal frequency $f_0$ may be the frequency of a resonator in the absence of temperature- and process-based variations. For ease of exposition, FIG. 6 depicts only linearized frequency variations. However, systems and method of the present disclosure may be applied to non-linear curves as well.

A ratio of the slope of a "non-average" resonator (e.g., shown in curve 604 or 606) to the slope of the average resonator (e.g., shown in curve 602) may provide a multiplicative factor that may, when multiplied by an approximate frequency compensation compensating for frequency variation at a particular temperature (e.g., calculated by predetermined temperature compensation calculator) provide a process-based compensation correction to frequency variation at the particular temperature. Accordingly, to calculate such process-dependent ratio, process compensation calculator 328 may, as described in greater detail below, determine a compensation factor approximating the ratio between the slope of the frequency variation versus variable capacitance for oscillator 210 having a resonator 310 (e.g., having a linearized frequency versus load capacitance curve represented by curve 604) and the expected slope of the frequency variation versus variable capacitance for oscillator 210 having a resonator with properties approximating average properties for a lot of resonators from which resonator 310 may be drawn (e.g., having a linearized frequency versus load capacitance curve represented by curve 602). As one of skill in the art may recognize, for a value $C_i$ of variable capacitance not equal to calibration capacitance $C_0$, the ratio of the frequency variation at $C_i$ for oscillator 210 having resonator 310 (e.g., point 610 on curve 604) to the expected frequency variation at $C_i$ for oscillator 210 having a resonator with properties approximating average properties for a lot of resonators from which resonator 310 may be drawn (e.g., point 612 on curve 602), wherein the expected frequency variation is based on characterization of the lot of resonators. Process compensation calculator 328 may also output the process-based compensation signal indicative of such calculated ratio.

Multiplier 330 may be any system, device, or apparatus configured to, based on the temperature-based frequency compensation signals and the process-based compensation signal, output a multiplier output signal. The multiplier output signal may be indicative of the approximate temperature-based frequency compensation calculated by predetermined temperature compensation calculator 324 multiplied by the approximate process compensation ratio calculated by process compensation calculator 328.

Control module 332 may be configured to, based on the multiplier output signal, communicate a control signal to variable capacitor 314 to select a variable capacitance to compensate for temperature and/or process based variation in resonator 310 such that oscillator 210 provides an oscillation signal at a desired frequency despite variations in temperature or manufacturing process of resonator 310.

In operation, components of oscillator 210 may be operable to calculate the approximate process compensation ratio and the process-based compensation signal during phasing of oscillator 210 and/or wireless communication device 200 prior to delivery to an intended end user. In such phasing process, control module 332 may be configured such that, during phasing, it selects a variable capacitance of variable capacitor 314 significantly non-equal to a calibration capacitance $C_0$. The calibration capacitance $C_0$ is the capacitance at which oscillator 210 will operate at the nominal frequency $f_0$ with approximately no frequency variation present, provided the temperature of resonator 310 is approximately at $T_0$, the calibration temperature at which oscillator 210 will operate at the nominal frequency $f_0$ with approximately no temperature-dependent frequency variation. The selected variable capacitance may cause oscillator to operate at a frequency other than $f_0$. Frequency estimator 326 may estimate such frequency of operation and communicate the frequency estimation signal to process compensation calculator 328. Based on the operating frequency, process compensation calculator 328 may determine the actual frequency variation (e.g., in ppm) from $f_0$ and calculate a process-based compensation as the ratio of the actual frequency variation to an expected frequency variation in the absence of process variation (e.g., the expected frequency variation of an oscillator with an "average" resonator). Such expected frequency variation may be based on characterization of a lot of resonators from which resonator 310 is drawn. In some embodiments, such expected frequency variation may be determined by temperature compensation calculator 324 based on characterization data stored (e.g., on a ROM) in wireless communication device 200. After calculating the process-based compensation, process compensation calculator 328 may store data indicative of the process-based compensation. During subsequent operation of wireless communication device 200 and oscillator 210, such stored data indicative of the process-based compensation may be communicated by process compensation calculator 328 or another component of wireless communication device 200 to multiplier 330 in the form of the process-based compensation signal, such that the process-based compensation ratio may be multiplied by the temperature-based compensation (e.g., generated by predetermined temperature compensation calculator 324) to generate an aggregate compensation signal which may then be used by control module 332 to select an appropriate capacitance for variable capacitor 314 to compensate for temperature- and process-dependent variations in operating frequency of resonator 310.

Certain components of oscillator 210 (e.g., predetermined temperature compensation calculator, frequency estimator 326, process compensation calculator 328, multiplier 330, and/or control module 332) may be implemented in whole or part as or a part of one or more microprocessors, digital signal processors, and/or other suitable devices.

A component of network wireless communication device 200 may include an interface, logic, memory, and/or other suitable element. An interface receives input, sends output, processes the input and/or output, and/or performs other suitable operations. An interface may comprise hardware and/or software.

Logic performs the operations of the component, for example, executes instructions to generate output from input. Logic may include hardware, software, and/or other logic. Logic may be encoded in one or more tangible computer readable storage media and may perform operations when executed by a computer. Certain logic, such as a processor, may manage the operation of a component. Examples of a processor include one or more computers, one or more microprocessors, one or more applications, and/or other logic.

A memory stores information. A memory may comprise one or more tangible, computer-readable, and/or computer-executable storage medium. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Modifications, additions, or omissions may be made to wireless communication device 200 from the scope of the disclosure. The components of wireless communication device 200 may be integrated or separated. Moreover, the operations of wireless communication device may be performed by more, fewer, or other components. As used in this document, "each" refers to each member of a set or each member of a subset of a set.

Although the present disclosure has been described with several embodiments, various changes and modifications may be suggested to one skilled in the art. It is intended that the present disclosure encompass such changes and modifications as fall within the scope of the appended claims.

What is claimed is:

1. A wireless communication element, comprising:
    a receive path configured to receive a first wireless communication signal and convert the first wireless communication signal into a first digital signal based at least on an oscillator signal;
    a transmit path configured to convert a second digital signal into a second wireless communication signal based at least on the oscillator signal and transmit the second wireless communication signal; and
    an oscillator configured to output the oscillator signal to at least one of the receive path and the transmit path, the oscillator comprising:
        a resonator;
        a temperature sensor configured to output a temperature signal indicative of an ambient temperature of the oscillator;
        a temperature compensation calculator configured to, based on the temperature signal, output a temperature-based frequency compensation signal;
        a frequency estimator configured to, based on a detected approximate frequency of operation of the oscillator, output a frequency estimation signal;
        a process compensation calculator configured to, based on the frequency estimation signal, output a process-based compensation signal that is based on a ratio of an actual frequency variation indicated by the frequency estimation signal to an expected frequency variation in the absence of process-dependent frequency variation;
        a control module configured to, based on the temperature-based frequency compensation signal and the process-based compensation signal, output a control signal; and
        a variable capacitor coupled to the resonator, a capacitance of the variable capacitor established based on the control signal.

2. A wireless communication element according to claim 1, the temperature compensation signal further configured to output the temperature-based frequency compensation signal based on characterization data characterizing an expected frequency variation of the resonator as a function of temperature.

3. A wireless communication element according to claim 2, wherein the characterization data is determined by characterization of a lot of resonators from which the resonator is drawn.

4. A wireless communication element according to claim 1:
    the frequency estimator configured to output the frequency estimation signal during a phasing of the wireless communication element in which the capacitance of the variable capacitor is set to a process calibration capacitance; and
    the process compensation calculator further configured to:
        based on the frequency estimation signal, determine the actual frequency variation from a nominal frequency expected in the absence of temperature-dependent and process-dependent frequency variation;
        calculate the ratio of the actual frequency variation to expected frequency variation from the nominal frequency, the expected frequency variation expected in the absence of process-dependent frequency variation at the process calibration capacitance; and
        based on the ratio, output the process-based compensation signal.

5. A wireless communication element according to claim 4, the control module further configured to, during the phasing, set the variable capacitor to the process calibration capacitance.

6. A wireless communication element according to claim 5, the process calibration capacitance equal to a capacitance significantly not equal to a calibration capacitance for which the oscillator is expected to operate at the nominal frequency when the variable capacitance is set to the calibration capacitance in the absence of temperature-dependent and process-dependent frequency variation.

7. A wireless communication element according to claim 1:
    the oscillator further comprising a multiplier further to calculate a multiplier output signal based on the temperature-based frequency compensation signal and the process-based compensation signal; and
    the control module configured to output the control signal based on the multiplier output signal.

8. An oscillator, comprising:
    a resonator;
    a temperature sensor configured to output a temperature signal indicative of an ambient temperature of the oscillator;
    a temperature compensation calculator configured to, based on the temperature signal, output a temperature-based frequency compensation signal;
    a frequency estimator configured to, based on a detected approximate frequency of operation of the oscillator, output a frequency estimation signal;
    a process compensation calculator configured to, based on the frequency estimation signal, output a process-based compensation signal that is based on a ratio of an actual frequency variation indicated by the frequency estimation signal to an expected frequency variation in the absence of process-dependent frequency variation;
a control module configured to, based on the temperature-based frequency compensation signal and the process-based compensation signal, output a control signal; and
a variable capacitor coupled to the resonator, a capacitance of the variable capacitor established based on the control signal.

9. An oscillator according to claim 8, the temperature compensation signal further configured to output the temperature-based frequency compensation signal based on characterization data characterizing an expected frequency variation of the resonator as a function of temperature.

10. An oscillator according to claim 9, wherein the characterization data is determined by characterization of a lot of resonators from which the resonator is drawn.

11. An oscillator according to claim 8:
the frequency estimator configured to output the frequency estimation signal during a phasing of the oscillator in which the capacitance of the variable capacitor is set to a process calibration capacitance; and
the process compensation calculator further configured to:
based on the frequency estimation signal, determine the actual frequency variation from a nominal frequency expected in the absence of temperature-dependent and process-dependent frequency variation;
calculate the ratio of the actual frequency variation to the expected frequency variation from the nominal frequency, the expected frequency variation expected in the absence of process-dependent frequency variation at the process calibration capacitance; and
based on the ratio, output the process-based compensation signal.

12. An oscillator according to claim 11, the control module further configured to, during the phasing, set the variable capacitor to the process calibration capacitance.

13. An oscillator according to claim 12, the process calibration capacitance equal to a capacitance significantly not equal to a calibration capacitance for which the oscillator is expected to operate at the nominal frequency when the variable capacitance is set to the calibration capacitance in the absence of temperature-dependent and process-dependent frequency variation.

14. An oscillator according to claim 8 further comprising a multiplier further to calculate a multiplier output signal based on the temperature-based frequency compensation signal and the process-based compensation signal; and
the control module configured to output the control signal based on the multiplier output signal.

15. A method, comprising:
determining an ambient temperature of an oscillator;
based on the ambient temperature, determining a temperature-based compensation to be applied to a resonator of the oscillator; and
estimating an approximate frequency of operation of the oscillator;
based on the approximate frequency, determining a process-based compensation to be applied to a resonator of the oscillator, the process-based compensation based on a ratio of an actual frequency variation indicated by the frequency estimation signal to an expected frequency variation in the absence of process-dependent frequency variation; and
based on the temperature-based compensation and the process-based compensation, setting a capacitance of a variable capacitor coupled to the resonator in order to compensate for temperature-dependent and process-dependent frequency variation of the oscillator.

16. A method according to claim 15, wherein determining a temperature-based compensation to be applied to a resonator of the oscillator comprises determine the temperature-based compensation based on characterization data characterizing an expected frequency variation of the resonator as a function of temperature.

17. A method according to claim 16, wherein the characterization data is determined by characterization of a lot of resonators from which the resonator is drawn.

18. A method according to claim 16, wherein estimating an approximate frequency of operation of the oscillator occurs during a phasing of the oscillator in which the capacitance of the variable capacitor is set to a process calibration capacitance; and the method further comprising
based on the approximate frequency of operation, determining the actual frequency variation of the oscillator from a nominal frequency expected in the absence of temperature-dependent and process-dependent frequency variation;
calculating the ratio of the actual frequency variation to the expected frequency variation from the nominal frequency, the expected frequency variation expected in the absence of process-dependent frequency variation at the process calibration capacitance; and
based on the ratio, determining the process-based compensation.

19. A method according to claim 18, further comprising setting the variable capacitor to the process calibration capacitance during the phasing.

20. A method according to claim 19, the process calibration capacitance equal to a capacitance significantly not equal to a calibration capacitance for which the oscillator is expected to operate at the nominal frequency when the variable capacitance is set to the calibration capacitance in the absence of temperature-dependent and process-dependent frequency variation.

* * * * *